US010588097B2

(12) United States Patent
Sutskover et al.

(10) Patent No.: US 10,588,097 B2
(45) Date of Patent: Mar. 10, 2020

(54) TRANSMISSION POWER ADJUSTMENT BASED ON DECLARED ANTENNA GAIN

(71) Applicant: Intel Corporation, Santa Clara, CA (US)

(72) Inventors: Ilan Sutskover, Hadera (IL); Wilfrid D'Angelo, Mougins (FR); Eran Friedlander, Rehovot (IL); Nadav Kahana, Zikhron Yaaqov (IL); Noam Kogos, Ramat Hasharon (IL); Baruch Navon, Kibbutz Alumot (IL); Leor Rom, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/143,730

(22) Filed: Sep. 27, 2018

(65) Prior Publication Data
US 2019/0045462 A1 Feb. 7, 2019

(51) Int. Cl.
*H04W 52/36* (2009.01)
*H04W 52/00* (2009.01)
*H03K 19/094* (2006.01)
*H04B 17/13* (2015.01)

(52) U.S. Cl.
CPC .... *H04W 52/367* (2013.01); *H03K 19/09425* (2013.01); *H04B 17/13* (2015.01)

(58) Field of Classification Search
CPC .... H04W 52/367; H04W 52/30; H04B 17/13; H03K 19/09425
See application file for complete search history.

(56) References Cited

U.S. PATENT DOCUMENTS

| | | | | |
|---|---|---|---|---|
| 2002/0000573 A1* | 1/2002 | Higuchi | ............. | H01L 27/0605 257/197 |
| 2005/0143115 A1* | 6/2005 | Hiddink | ............. | H04W 52/267 455/522 |
| 2016/0234790 A1* | 8/2016 | D'Angelo | ............... | H04L 43/16 |
| 2016/0366015 A1* | 12/2016 | Prendergast | ........... | G05B 19/02 |

* cited by examiner

*Primary Examiner* — Dong-Chang Shiue
(74) *Attorney, Agent, or Firm* — Jordan IP Law, LLC

(57) ABSTRACT

An embodiment of a semiconductor package apparatus may include technology to determine declared antenna gain-related information that corresponds to an estimated actual antenna gain for an antenna, and adjust a parameter of a wireless subsystem based on the declared antenna gain-related information. Other embodiments are disclosed and claimed.

25 Claims, 9 Drawing Sheets

42

|  | Chain A limitations [dBm] | | | |
|---|---|---|---|---|
| Channel | Power prof. #0 | Power prof. #1 | Power prof. #2 | Power prof. #3 |
| 1 | 30 | 15.5 | 16 | 18 |
| 2 | 30 | 20 | 16 | 18.5 |
| ... | | | | |
| N | 30 | 15.5 | 16 | 18 |

Assumed Antenna Gain = 3 dBi

|  | Chain A limitations [dBm] | | | |
|---|---|---|---|---|
| Channel | Power prof. #0 | Power prof. #1 | Power prof. #2 | Power prof. #3 |
| 1 | 15.5 | 15.5 | 19 | 18 |
| 2 | 18.5 | 20 | 19 | 18.5 |
| ... | | | | |
| N | 15.5 | 15.5 | 19 | 18 |

Declared Antenna Gain = 0 dBi

| Channel | Chain A limitations [dBm] | | | |
|---|---|---|---|---|
| | Power prof. #0 | Power prof. #1 | Power prof. #2 | Power prof. #3 |
| 1 | 15.5 | 15.5 | 19 | 18 |
| 2 | 18.5 | 20 | 19 | 18.5 |
| ... | | | | |
| N | 15.5 | 15.5 | 19 | 18 |

Assumed Antenna Gain = 0 dBi

| Channel | Chain A limitations [dBm] | | | |
|---|---|---|---|---|
| | Power prof. #0 | Power prof. #1 | Power prof. #2 | Power prof. #3 |
| 1 | 15.5 | 15.5 | 16 | 18 |
| 2 | 16 | 20 | 16 | 18.5 |
| ... | | | | |
| N | 15.5 | 15.5 | 16 | 18 |

Declared Antenna Gain = 3 dBi

FIG. 5B

| Field | Field Description | Value (Bold: default) |
|---|---|---|
| Revision | Identifies the revision ID of the XXXX object | 0 |
| Domain Type | Identifies the applied domain for the specific package data | 0x7 – Wi-Fi Core |
| Wi-Fi ANT_gain BIOS | Defines the mode of ANT_gain control to be used:<br><br>BIOS ANT_gain Disabled – no Tx power adjustment due to ANT_gain<br><br>BIOS ANT_gain Enabled – use the ANT_gain tables to adjust TX Power | 0x0 – BIOS ANT_gain Disabled<br><br>0x1 – BIOS ANT_gain Enabled |
| ANT_gain Table Chain A | Defines the ANT_gain in dBi for chain A to be used in case of ANT_gain control set to BIOS ANT_gain Enabled | ANT_gain table structure defined in Table (FIG. 5E) |
| ANT_gain Table Chain B | Defines the ANT_gain in dBi for chain B to be used in case of ANT_gain control set to BIOS ANT_gain Enabled | ANT_gain table structure defined in Table (FIG. 5E) |

FIG. 5C

| Field | Field Description | Allowed Range | Expected Value (Bold: default) | Format |
|---|---|---|---|---|
| ANT_gain_2400 | Defines the Antenna gain being used for the relevant chain in 2400MHz frequency | -3dBi : 3dBi (0.125dBi resolution) Values out of range are not allowed and will result in Driver Error | 3dBi | 8 bit, signed, Two's complement 0.125dB per LSB, min ('10000000') is -16dBm, max ('01111111') is 15.875Bm with 0.125dB steps (8 bit signed) *Manual input* |
| ANT_gain_5150_5350 | Defines the Antenna gain being used for the relevant chain in 5150–5350MHz frequency | -3dBi : 5dBi (0.125dBi resolution) Values out of range are not allowed and will result in Driver Error | 5dBi | 8 bit, signed, Two's complement 0.125dB per LSB, min ('10000000') is -16dBm, max ('01111111') is 15.875Bm with 0.125dB steps (8 bit signed) *Manual input* |
| ANT_gain_5350_5470 | Defines the Antenna gain being used for the relevant chain in 5350–5470MHz frequency | -3dBi : 5dBi (0.125dBi resolution) Values out of range are not allowed and will result in Driver Error | 5dBi | 8 bit, signed, Two's complement 0.125dB per LSB, min ('10000000') is -16dBm, max ('01111111') is 15.875Bm with 0.125dB steps (8 bit signed) *Manual input* |
| ANT_gain_5470_5725 | Defines the Antenna gain being used for the relevant chain in 5470–5725MHz frequency | -3dBi : 5dBi (0.125dBi resolution) Values out of range are not allowed and will result in Driver Error | 5dBi | 8 bit, signed, Two's complement 0.125dB per LSB, min ('10000000') is -16dBm, max ('01111111') is 15.875Bm with 0.125dB steps (8 bit signed) *Manual input* |
| ANT_gain_5725_5950 | Defines the Antenna gain being used for the relevant chain in 5725–5950MHz frequency | -3dBi : 5dBi (0.125dBi resolution) Values out of range are not allowed and will result in Driver Error | 5dBi | 8 bit, signed, Two's complement 0.125dB per LSB, min ('10000000') is -16dBm, max ('01111111') is 15.875Bm with 0.125dB steps (8 bit signed) *Manual input* |

FIG. 5D

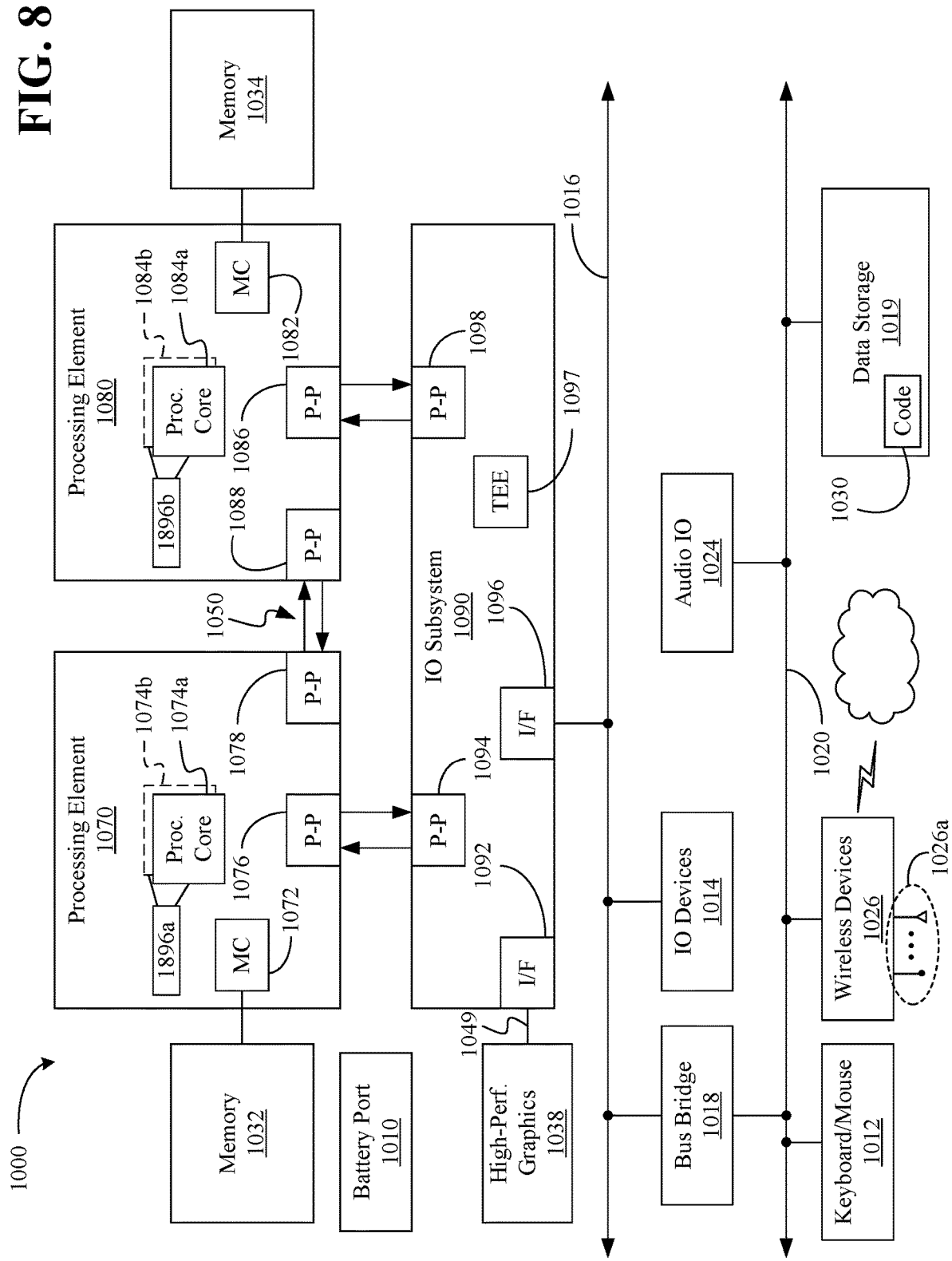

TRANSMISSION POWER ADJUSTMENT BASED ON DECLARED ANTENNA GAIN

TECHNICAL FIELD

Embodiments generally relate to wireless systems. More particularly, embodiments relate to transmission power adjustment based on declared antenna gain.

BACKGROUND

Transmitting devices may be subject to regulatory limitations that may be country specific. These limitations are generally stated in terms of maximum transmit (TX) power, because typically increase of TX power gradually degrades performance. Limitations world-wide, in particular as observed from the point of view of WIFI devices, are due to out of band emission requirements (also known as band-edge (BE) requirements) that are common with the Federal Communications Commission (FCC), or due to power spectral density (PSD) limitations. BE requirements may typically be set to guarantee controlled interference to adjacent spectral bands, and the PSD limitations may be set to guarantee controlled interference caused to in-band incumbents (e.g., such as radars and satellites).

BRIEF DESCRIPTION OF THE DRAWINGS

The various advantages of the embodiments will become apparent to one skilled in the art by reading the following specification and appended claims, and by referencing the following drawings, in which:

FIGS. 4A to 4B are illustrative diagrams of examples of transmission power regulatory tables according to an embodiment;

FIGS. 5A to 5B are illustrative diagrams of other examples of transmission power regulatory tables according to an embodiment;

FIGS. 5C to 5D are illustrative tables of examples of BIOS field values and descriptions according to an embodiment;

FIG. 8 is a block diagram of an example of a system according to an embodiment.

DESCRIPTION OF EMBODIMENTS

Figure 1:
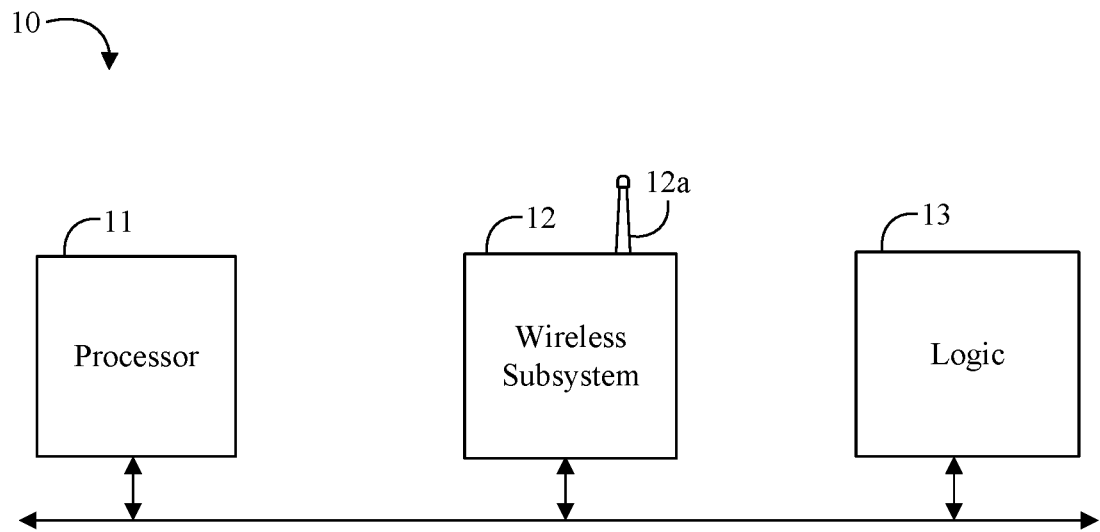
FIG. 1 is a block diagram of an example of an electronic processing system according to an embodiment.

Turning now to FIG. 1, an embodiment of an electronic processing system 10 may include a processor 11, a wireless subsystem 12 communicatively coupled to the processor 11, an antenna 12a coupled to the wireless subsystem 12, and logic 13 communicatively coupled to the processor 11 and the wireless subsystem 12 to determine declared antenna gain-related information that corresponds to an estimated actual antenna gain for the antenna 12a, and adjust a parameter of the wireless subsystem 12 based on the declared antenna gain-related information. For example, the estimated actual antenna gain may correspond to a measured antenna gain. For a high-volume device, for example, a platform manufacturer may measure the device's antenna gain on a small sample size, and may assume that the measurements reflect on the general population of the assembled antennas. In some embodiments, the logic 13 may be configured to retrieve the declared antenna gain-information from a basic input/output system (BIOS). For example, the logic 13 may be configured to adjust a transmission power of the wireless subsystem 12 based on the declared antenna gain-related information. In some embodiments, the logic 13 may be further configured to determine if the declared antenna gain-related information is valid based on one or more of a validity indicator, a region indicator, a vendor indicator, and authentication information. The logic 13 may also be configured to select a profile based on the region indicator, modify the profile based on the declared antenna gain-related information, and apply the modified profile to the wireless subsystem 12. In some embodiments, the logic 13 may be configured to determine a maximum permitted transmission power, and adjust a transmission power for the wireless subsystem 12 based on the maximum permitted transmission power and the declared antenna gain-related information. In some embodiments, the wireless subsystem 12 and/or the logic 13 may be located in, or co-located with, various components, including each other and/or the processor 11 (e.g., on a same die).

Embodiments of each of the above processor 11, wireless subsystem 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the processor 11 may include a general purpose processor, a special purpose processor, a central processor unit (CPU), a controller, a micro-controller, etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C # or the like and conventional procedural programming languages, such as the "C" programming language or similar programming languages. For example, system memory, persistent storage media, or other memory may store a set of instructions which when executed by the processor 11 cause the system 10 to implement one or more components, features, or aspects of the system 10 (e.g., the logic 13, determining the declared antenna gain-related information, adjust the parameter of the wireless subsystem based on the declared antenna gain-related information, etc.).

Figure 2:
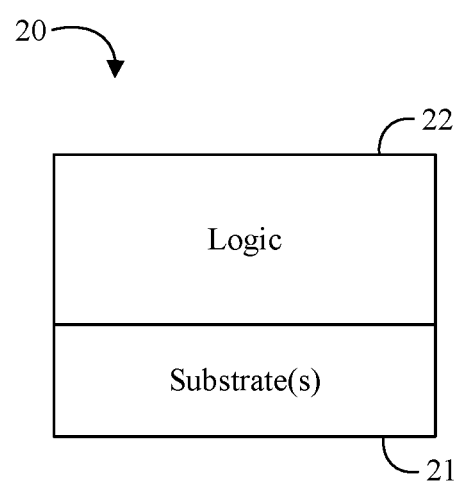
FIG. 2 is a block diagram of an example of a semiconductor package apparatus according to an embodiment.

Turning now to FIG. 2, an embodiment of a semiconductor package apparatus 20 may include one or more substrates 21, and logic 22 coupled to the one or more substrates 21, wherein the logic 22 is at least partly implemented in one or more of configurable logic and fixed-functionality hardware logic. The logic 22 coupled to the one or more substrates 21 may be configured to determine declared antenna gain-related information that corresponds to an estimated actual antenna gain for an antenna, and adjust a parameter of a wireless subsystem based on the declared antenna gain-related information. In some embodiments, the logic 22 may be configured to retrieve the declared antenna gain-information from a BIOS. For example, the logic 22 may be configured to adjust a transmission power of the wireless subsystem based on the declared antenna gain-related information. In some embodiments, the logic 22 may be further configured to determine if the declared antenna gain-related information is valid based on one or more of a validity indicator, a region indicator, a vendor indicator, and authentication information. The logic 22 may also be configured to select a profile based on the region indicator, modify the profile based on the declared antenna gain-related information, and apply the modified profile to the wireless subsystem. In some embodiments, the logic 22 may be configured to determine a maximum permitted transmission power, and adjust a transmission power for the wireless subsystem based on the maximum permitted transmission power and the declared antenna gain-related information. In some embodiments, the logic 22 coupled to the one or more substrates 21 may include transistor channel regions that are positioned within the one or more substrates 21.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

The apparatus 20 may implement one or more aspects of the method 30 (FIGS. 3A to 3C), or any of the embodiments discussed herein. In some embodiments, the illustrated apparatus 20 may include the one or more substrates 21 (e.g., silicon, sapphire, gallium arsenide) and the logic 22 (e.g., transistor array and other integrated circuit/IC components) coupled to the substrate(s) 21. The logic 22 may be implemented at least partly in configurable logic or fixed-functionality logic hardware. In one example, the logic 22 may include transistor channel regions that are positioned (e.g., embedded) within the substrate(s) 21. Thus, the interface between the logic 22 and the substrate(s) 21 may not be an abrupt junction. The logic 22 may also be considered to include an epitaxial layer that is grown on an initial wafer of the substrate(s) 21.

Figure 3A:
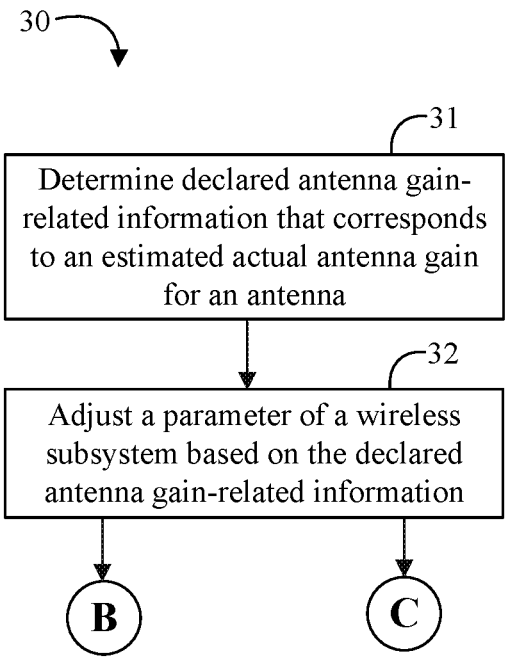
FIGS. 3A to 3C are flowcharts of an example of a method of managing a wireless subsystem according to an embodiment.
Figure 3B:
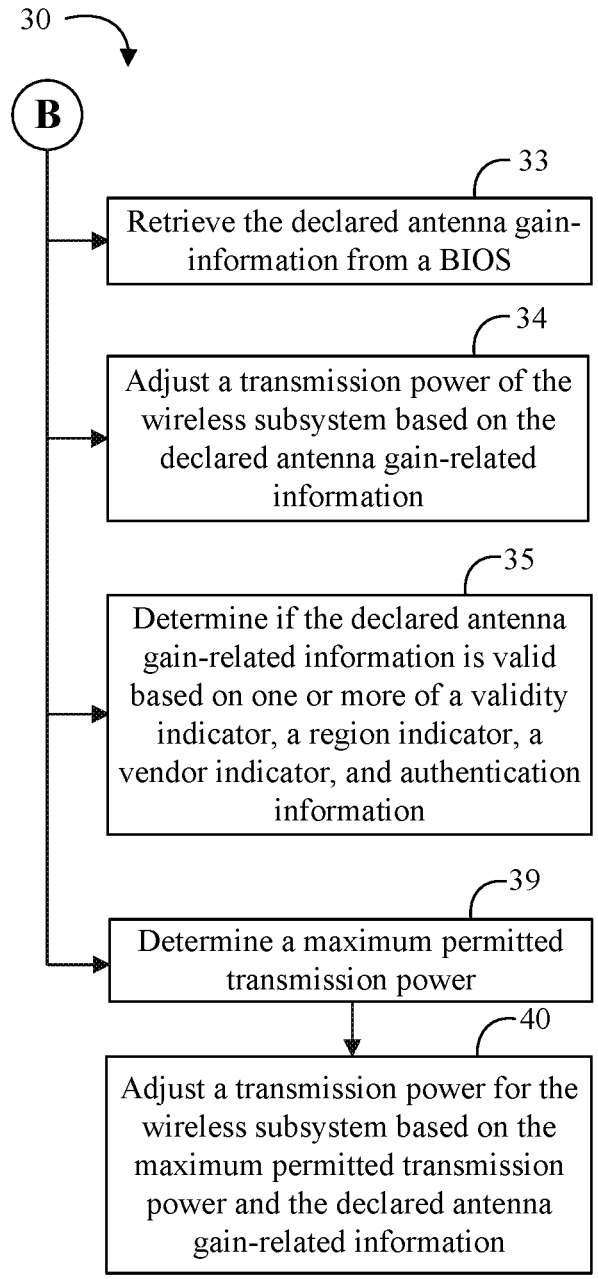
Figure 3C:
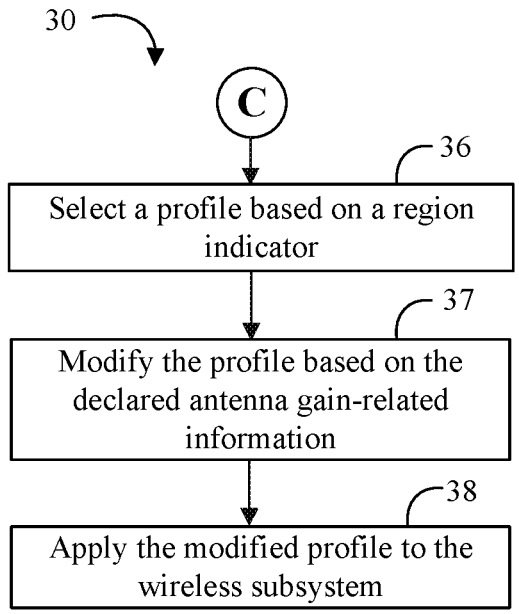

Turning now to FIGS. 3A to 3C, an embodiment of a method 30 of managing a wireless subsystem may include determining declared antenna gain-related information that corresponds to an estimated actual antenna gain for an antenna at block 31, and adjusting a parameter of a wireless subsystem based on the declared antenna gain-related information at block 32. Some embodiments of the method 30 may include retrieving the declared antenna gain-information from a BIOS at block 33. For example, the method 30 may include adjusting a transmission power of the wireless subsystem based on the declared antenna gain-related information at block 34. Some embodiments of the method 30 may also include determining if the declared antenna gain-related information is valid based on one or more of a validity indicator, a region indicator, a vendor indicator, and authentication information at block 35. In some embodiments, the method 30 may further include selecting a profile based on the region indicator at block 36, modifying the profile based on the declared antenna gain-related information at block 37, and applying the modified profile to the wireless subsystem at block 38. Some embodiments of the method 30 may also include determining a maximum permitted transmission power at block 39, and adjusting a transmission power for the wireless subsystem based on the maximum permitted transmission power and the declared antenna gain-related information at block 40.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

For example, the method 30 may be implemented on a computer readable medium as described in connection with Examples 20 to 25 below. Embodiments or portions of the method 30 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide antenna gain handling for transmit (TX) power limitations. For example, such power limitations may be technical-related (e.g., maximum power of device without potentially causing damage), power management related (e.g., reduced component power in a low-power mode), discretionary (e.g., complying with regulatory limitations), etc. Different countries may define their own regulatory limitations (e.g., based on their own interests, policies, etc.). For example, the US defines much stricter BE limitations than Europe, while Europe defines much stricter PSD limitations than the US. Some wireless devices may support multiple regulatory limitations by defining several TX power profiles that may be specific to some countries. In particular, US and Europe may have different power profiles, and the appropriate power profile, holding the limitations, may be selected based on geographic knowledge (e.g., from cellular base stations, etc.). When the country/region identification is unknown, a worldwide power profile may be selected, whose limitations correspond to a worldwide worst case power profile. In addition to specifying different limitations/values, selecting a particular profile may involve different handling per profile (e.g., different techniques/algorithms). Some embodiments may further provide technology to disable any antenna gain-based adjustment features (e.g., for complete compatibility with prior certification processes).

A typical computer/tablet/mobile platforms' antenna for WIFI may have antenna gain (including cable loss) that is below +5 dBi at 5 GHZ (e.g., or below 3 dBi at 2.4 GHz). The parameter of relevance may correspond to the maximum antenna gain (e.g., in a sphere or a cylinder surrounding) that an antenna passes. There is typically only one or few directions at which the antenna gain reaches that level. For regulatory purposes, the term antenna gain may refer to the maximal gain of the antenna. Regulatory TX power limitations are generally required to address antenna gain as well, because regulatory limitations concern Effective Isotropic Radiation Pattern (EIRP) values outside of the platform.

Wireless subsystems may include module type devices (e.g., that plug-in to a PCIe slot, a universal serial bus (USB) port, a universal asynchronous receiver/transmitter (UART), etc.). Such modules may be pre-certified such that vendors and/or original equipment manufacturers (OEMs) may utilize the module and need not test it for certification by themselves. However, because the pre-certified module may be platform-agnostic, the wireless module may assume a worst case antenna gain, which may correspond to the maximal supported antenna gain (e.g., +5 dBi for a 5 GHz WIFI band, +3 dBi for a 2.4 GHz WIFI band, etc.). This results in relatively worse performance for low-gain antennas. However, in practice many or most antennas may have gains spread over −1 dBi to +1 dBi. Some embodiments may advantageously provide module certification while enabling a platform to securely declare an antenna gain. Advantageously, the declared antenna gain value may be applied to the wireless subsystem to address technical, power management, and/or regulatory limits. With respect to regulatory limits, some embodiments may advantageously enable higher TX power from the device when the declared antenna gain is lower, resulting in improved performance for such platforms.

As noted above, a conventional approach for addressing the antenna gain is by relying on worst-case gain, which is maximal gain. For example, if Europe allows 23 dBm TX power for 20 MHz transmissions (EIRP), and if worst-case antenna gain is +5 dBi, then TX power cannot exceed 18 dBm at the antenna connector for 20 MHz packets. A number such as 18 dBm (e.g., possibly with an additional margin to address high volume manufacturing) may be then written to the tables corresponding the regulatory limitations and limits the TX power of all platforms. With the foregoing example, platforms with true 5 dBi will thus reach indeed 23 dBm EIRP, but platforms with 1 dBi will reach only 19 dBm EIRP and thus will be 4 dB deficient compared to the high-gain platforms. Some embodiments may enable the platform to declare an antenna gain value and then use the declared antenna gain value to adjust the TX power at the antenna port from 18 dBm to 22 dBm, providing an overall TX power of 23 dBm (e.g., within the maximum limit) while advantageously increasing the platform TX power by 4 dB.

Some embodiments may introduce one or more new fields in the BIOS of personal computer (PC) and/or server platforms to declare the antenna gain of the platform. In one embodiment, a regulatory limits table, which may be exposed to users/administrators/vendors/etc., may reflect worst case antenna gain (e.g., such that the table may be compatible with conventional systems). The firmware may obtain a declared antenna gain from the BIOS and accordingly increase the TX power limit by the difference of the declared antenna gain compared to the antenna gain value with which the platform was certified. For example, one-time programmable (OTP) memory may hold a regulatory limit of 15 dBm, suitable for a 5 dBi antenna gain assumption, and upon BIOS returning a declared antenna gain value of 1 dBi, the firmware may calculate 15+(5−1)=19 dBm to be the new TX power limit.

In another embodiment, a regulatory limits table may be updated to reflect a baseline antenna gain that corresponds to a minimal supported antenna gain value (e.g., 1 dBi) and firmware, upon obtaining a declared antenna gain value from the BIOS, will apply a limit that is equal to the specified limit minus the antenna gain difference. For example, the OTP memory may hold a regulatory limit of 19 dBm, suitable for 1 dBi, and upon a platform with a declared antenna gain of 5 dBi the firmware may calculate 19−(5−1)=15 dBm (e.g., but for a platform with a declared antenna gain=1 dBi the calculation may be 19−(1−1)=19 dBm). In another embodiment, the BIOS may simply store a difference or modification value based on a measured/characterized/estimated antenna gain for the platform that may be applied to the table (e.g., a modification value of +2 dB applied to a table value of 16 dBm would result in a TX power setting of 18 dBm). In any of the embodiments herein, if the platform does not declare the antenna gain (e.g., or if the declaration is not valid for some reason), then the firmware may assume the equivalent of a declared worst case gain (e.g., as if 5 dBi were declared). In some embodiments, one or more additional BIOS fields may also be specified such that backward compatibility is maintained through a "valid" indication.

Those skilled in the art will appreciate that these are non-limiting examples and numerous other approaches may be used to adjust the TX power based on information related to a provided actual or estimated antenna gain of the platform. For example, a special treatment may be provided for a worldwide TX power profile. Embodiments may be applied to any wireless communication technology where antenna gain may be taken into account including WIFI, BLUETOOTH, BLUETOOTH LOW ENERGY (BLE), etc. For WIFI systems which previously relied on worst case antenna gain assumptions, some embodiments may improve platform-level and module-level TX key performance indicators (KPI) in many countries, typically by 3-4 dB in the 5 GHz band and by 1-2 dB in the 2.4 GHz band. Without any additional improvement or complexity in the underlying transmission technology, some embodiments may provide a technological improvement to wireless devices that appears to effectively increase TX power and/or performance. Advantageously, some embodiments still support regulatory module certification, so that vendors/OEMs utilizing such modules may need little or further certification work, while not relying on worst case antenna gain assumptions.

BIOS Field Examples

Some embodiments may enable platforms to declare their antenna gain in the platforms BIOS settings. The BIOS setting may be a per-platform relatively secured database, which can be read by the installed wireless device (e.g., over secured communications). In some embodiments, the BIOS may include one or more antenna gain fields, one or more validity indicators, one or more vendor indicators, and one or more authentication fields. For example, antenna gain fields may include at least one value per band (e.g., 2.4 GHz and 5 GHz) or plural of values per band (e.g., differentiating between 5.15 GHz, 5.35 GHz, 5.47 Ghz, and 5.725 GHz). The validity indicators may include a valid 'bit' indicating that the BIOS antenna gain field values are valid. If the antenna gain is invalid in the BIOS, for example, the firmware may assume worst-case antenna gain. The vendor indicators may include a declaration of an OEM name, and the authentication fields may include a security key or other type of authentication signature (e.g., a cyclic redundancy check (CRC) value).

The wireless device software may determine the values of the various BIOS fields, and adjust one or more parameters of the wireless device based on the BIOS field values. For example, when the BIOS does not include the antenna gain fields and/or the valid bit field does not indicate valid data, the software may assume the platform has the worst case antenna gain (e.g., which may be a static default value or a may be read from new BIOS field). The software may read the BIOS settings, address the vendor indicator and compare the OEM name to a list of approved OEMs for which the declared antenna gain-based TX power adjustment feature is supported. For example, the list may include numbers, strings, patterns or other authentication formats. For example, comparing the vendor indicator information and the list of approved OEMs may help limit support of the antenna-gain based adjustment to OEMs who guarantee conformance and properly set of the declared antenna gain value in the BIOS. After software has confirmed that the platform corresponds to an approved OEM and that antenna gain values are valid, the technical activity of setting the TX power to meet the actual regulatory limits may be handled by the firmware.

Without being limited to specific implementations or theory of operation, it may be important in some applications that dB to dB behavior is more relevant to some regulatory limitations as compared to others. For example, PSD limitations are related to in-band power and thus EIRP power is dB to dB related to the antenna gain. However, band-edge power results from inter-modulations that can behave like dB (e.g., TX power) to about 2 dB to 3 dB (e.g., BE power). In the BE case, the antenna gain will relate to the out of band emission power and impact on TX power is harder to define for different antenna gain values (e.g., although there is some relationship). Some embodiments may define two "worst case" range values of antenna gain (e.g., between 2 dBi and dBi, and below 2 dBi) and may certify the module under both values. The wireless device may then choose the appropriate group of values according to the antenna gain declared in the BIOS. Alternatively, some embodiments may continue addressing the worst case antenna gain in the BE case and limit the benefit only to "dB to dB" types of limits. In addition to validity and/or OEM indicators, some embodiments may include region or geographic indicators (e.g., an indication per country, or per a "geographic profile" which corresponds to a set of countries). The region indicator(s) may provide another safety mechanism that may allow blocking the antenna gain-based adjustment in countries whose regulatory rules are unknown/unclear, or which preclude such adjustments.

Turning now to FIGS. 4A to 4B, illustrative examples of a first regulatory table 42 (FIG. 4A) may include an initial set of values for a plurality of channels and a plurality of power profiles (e.g., with an assumed antenna gain of 3 dBi), while a second regulatory table 44 (FIG. 4B) may include a modified set of values for the plurality of channels and the plurality of power profiles in accordance with some embodiments (e.g., for a declared antenna gain of 0 dBi). The structure of the regulatory tables 42, 44 may support a plurality of power profiles including, for example, a worldwide power profile #0, power profile #1 for regions where TX power may be limited by other than EIRP (e.g., similar to US regulations), power profile #2 for regions where TX power may be limited by mainly EIRP (e.g., similar to Europe regulations), etc. In some embodiments, the first regulatory table 42 may be stored in OTP memory (e.g., which may reside in the wireless device/module) and may hold values according to certification with worst-case assumed antenna values (e.g., 5 dBi in 5 GHz and 3 dBi in 2.4 GHz). Appropriate values may be provided for all power profiles. For some applications, values for the world-wide power profile #0 may be set very high (e.g., conceptually infinity, but practically 30 dBm may suffice). In some embodiment, the table 44 may be modified based on a declared antenna gain provided by an OEM. For example, changes may be made to the initial profile based on differences between the assumed antenna gain (e.g., corresponding to table 42, see FIG. 4A) and the declared antenna gain (e.g., resulting in table 44, see FIG. 4B).

A difference gain or delta gain (dG) may denote the antenna gain difference between the worst case antenna supported by certification to the actual antenna gain of the platform (e.g., dG=worst case value−actual value; dG=5 dBi−2 dBi=3 dB). Generally, the value dG should always be non-negative because the actual value should not be less than the worst case value. Firmware may then perform one or more of the following calculations to determine appropriate limit values for the second regulatory table 44: for power profile #3, Limit=OTP_limit_P3; for power profile #2 (e.g., EIRP limited), Limit=OTP_limit_P2+dG; for power profile #1 (e.g., other type f limitation), Limit=OTP_limit_P1; for power profile #0 (e.g., worldwide), Limit=min{OTP_limit_P0, OTP_limit_P1, OTP_limit_P2+dG, OTP_limit_P3}. Special treatment may be provided for short-range-devices (SRD) limitations (e.g., 5.8 GHz defined in Europe). For those channels some embodiments may define Limit=OTP_SRD+dG. Other embodiments may define the SRD limits as part of the worldwide worst-case power profile #0 in which case the limit may be defined as Limit=min {OTP_limit_P0+dG, OTP_limit_P1, OTP_limit_P2+dG, OTP_limit_P3}.

Note that some power profiles (e.g., power profile #1, power profile #3), may not directly benefit from utilizing dG for antenna-gain based adjustment, while other profiles (e.g., power profile #2) may benefit more directly. For example, TX power limits for such profiles, such as in US, may be BE limited on some channels and may be PSD limited on others (e.g., but the PSD limitations in the US are already relatively high), while power profile #2 may address dG in its calculations because, by definition, power profile #2 corresponds to EIRP limited regions (e.g., in Europe, through PSD mainly).

With respect to power profile #0, in many cases (e.g., when location is unknown) the limitations of power profile #0 may be used. Therefore, having these numbers increased by a few dBs over the absolute worst case may be important in many regions. Also, the foregoing equations still allow power profile #0 to represent the world-wide worst case (e.g., as the minimum TX power of all other power profiles) while still allowing adjustment of particular channels. For example, if a certain channel needs to be further limited world-wide (e.g., because of a new regulation of some other country), the OTP_limit_P0 can still perform that task (e.g., where that value may be set to be "low" instead of the conceptual infinity value). Some embodiments may alternatively not include OTP_limit_P0 in the OTP (e.g., because conceptually all values equal infinity), but to include only portions that are "non-infinity" explicitly mentioned. Some embodiments may also mark if the table OTP_limit_P0 is provided in the OTP (e.g., if it has non-infinity numbers) or not provided in the OTP (e.g., where the FW may assume implicit values of infinity).

Turning now to FIGS. 5A to 5B, illustrative examples of a first regulatory table 52 (FIG. 5A) may include an initial set of values for a plurality of channels and a plurality of power profiles (e.g., with an assumed antenna gain of 0 dBi), while a second regulatory table 54 (FIG. 5B) may include a modified set of values for the plurality of channels and the plurality of power profiles in accordance with some embodiments (e.g., for a declared antenna gain of 3 dBi). In these examples, the OTP may contain the regulatory limits as certified with a "best case" antenna gain. For example, some embodiments may define MinG as 0 dBi (e.g., a minimum antenna gain supported by the antenna-gain adjustment feature) and the OTP may contain values certified for the antenna gain of value MinG. In this example, the value dG may be calculated as dG=max{0, declared antenna gain–MinG}, where again dG>=0 by definition. Firmware may then perform one or more of the following calculations to determine appropriate limit values for the applied regulator table (e.g., as reflected in the first regulatory table 52 for a declared antenna gain of 0 dBi (dG=0), or as reflected in the second regulatory table 54 for a declared antenna gain of 3 dBi (dG=3)): for power profile #3, Limit=OTP_limit_P3; for power profile #2 (e.g., EIRP limited), Limit=OTP_limit_P2–dG; for power profile #1 (e.g., non-EIRP limited), Limit=OTP_limit_P1; for power profile #0 (e.g., world-wide): Limit=min{OTP_limit_P0, OTP_limit_P2–dG}. In some embodiments, special treatment may be provided for SRD limitations (e.g., 5.8 GHz defined in Europe). For those channels some embodiments may define Limit=OTP_SRD–dG. Other embodiments may define the SRD limits as part of the worldwide worst-case power profile #0 in which case the limit may be defined as Limit=min{OTP_limit_P0–dG, OTP_limit_P1, OTP_limit_P2–dG, OTP_limit_P3}

For the examples of FIGS. 5A to 5B, the power profile #0 numbers may be explicitly stated (e.g., not as infinity but as common denominator being lowest values) and thus minimization with other power profiles is usually not required except for power profile #2 that may be varying with antenna gain. For these examples, OTP limits may be higher than in the table 42 because the OTP limits in the table 52 may address the minimum antenna gain while the table 42 may address the maximum antenna gain.

Turning now to FIGS. 5C to 5D, illustrative tables with example BIOS fields and values show an embodiment of declared antenna gains. The table in FIG. 5C includes two embedded tables, whose format may correspond to the table in FIG. 5D.

Figure 6A:
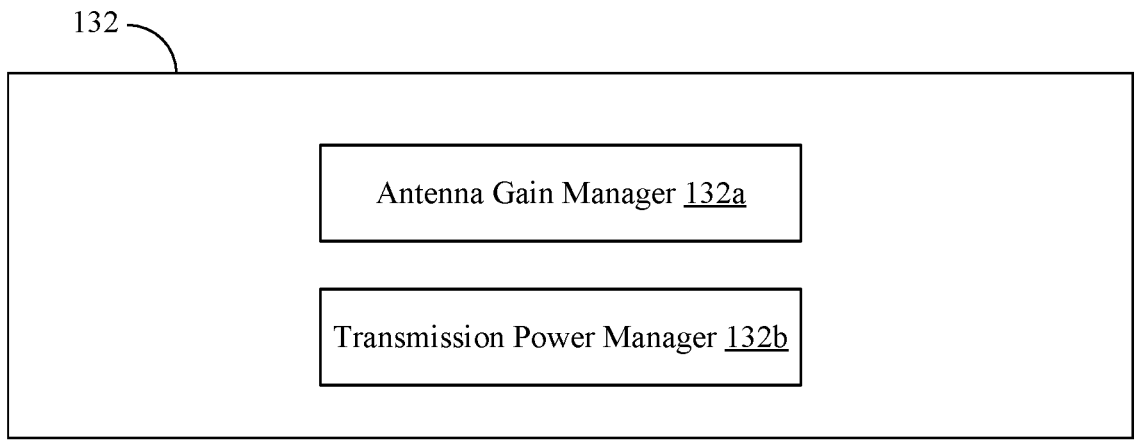
FIGS. 6A and 6B are block diagrams of examples of wireless subsystem management apparatuses according to embodiments.

FIG. 6A shows a wireless subsystem management apparatus 132 (132a-132b) that may implement one or more aspects of the method 30 (FIGS. 3A to 3C) and/or BIOS field/setting handling as discussed herein. The wireless subsystem management apparatus 132, which may include logic instructions, configurable logic, fixed-functionality hardware logic, may be readily substituted for the logic 13 (FIG. 1), already discussed. An antenna gain manager 132a may include technology to determine declared antenna gain-related information that corresponds to an estimated actual antenna gain for an antenna. A transmission power manager 132b may include technology to adjust a parameter of a wireless subsystem based on the declared antenna gain-related information. In some embodiments, the antenna gain manager 132a may be configured to retrieve the declared antenna gain-information from a BIOS. For example, the transmission power manager 132b may be configured to adjust a transmission power of the wireless subsystem based on the declared antenna gain-related information. In some embodiments, the antenna gain manager 132a may be further configured to determine if the declared antenna gain-related information is valid based on one or more of a validity indicator, a region indicator, a vendor indicator, and authentication information. The transmission power manager 132b may also be configured to select a profile based on the region indicator, modify the profile based on the declared antenna gain-related information, and the transmission power manager 132b may be further configured to apply the modified profile to the wireless subsystem. In some embodiments, the transmission power manager 132b may be configured to determine a maximum permitted transmission power, and adjust a transmission power for the wireless subsystem based on the maximum permitted transmission power and the declared antenna gain-related information.

Figure 6B:
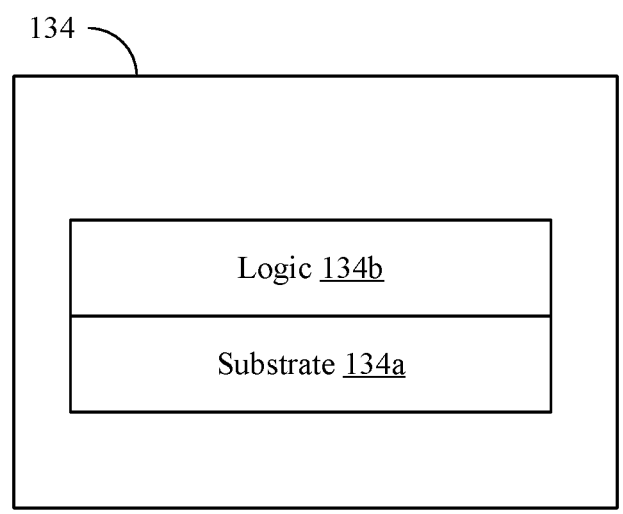

Turning now to FIG. 6B, wireless subsystem management apparatus 134 (134a, 134b) is shown in which logic 134b (e.g., transistor array and other integrated circuit/IC components) is coupled to a substrate 134a (e.g., silicon, sapphire, gallium arsenide). The logic 134b may generally implement one or more aspects of the method 30 (FIGS. 3A to 3C) and/or BIOS field/setting handling as discussed herein. Thus, the logic 134b may determine declared antenna gain-related information that corresponds to an estimated actual antenna gain for an antenna, and adjust a parameter of a wireless subsystem based on the declared antenna gain-related information. In some embodiments, the logic 134b may be configured to retrieve the declared antenna gain-information from a BIOS. For example, the logic 134b may be configured to adjust a transmission power of the wireless subsystem based on the declared antenna gain-related information. In some embodiments, the logic 134b may be further configured to determine if the declared antenna gain-related information is valid based on one or more of a validity indicator, a region indicator, a vendor indicator, and authentication information. The logic 134b may also be configured to select a profile based on the region indicator, modify the profile based on the declared antenna gain-related information, and apply the modified profile to the wireless subsystem. In some embodiments, the logic 134b may be configured to determine a maximum permitted transmission power, and adjust a transmission power for the wireless subsystem based on the maximum permitted transmission power and the declared antenna gain-related information. In one example, the apparatus 134 is a semiconductor die, chip and/or package.

Figure 7:
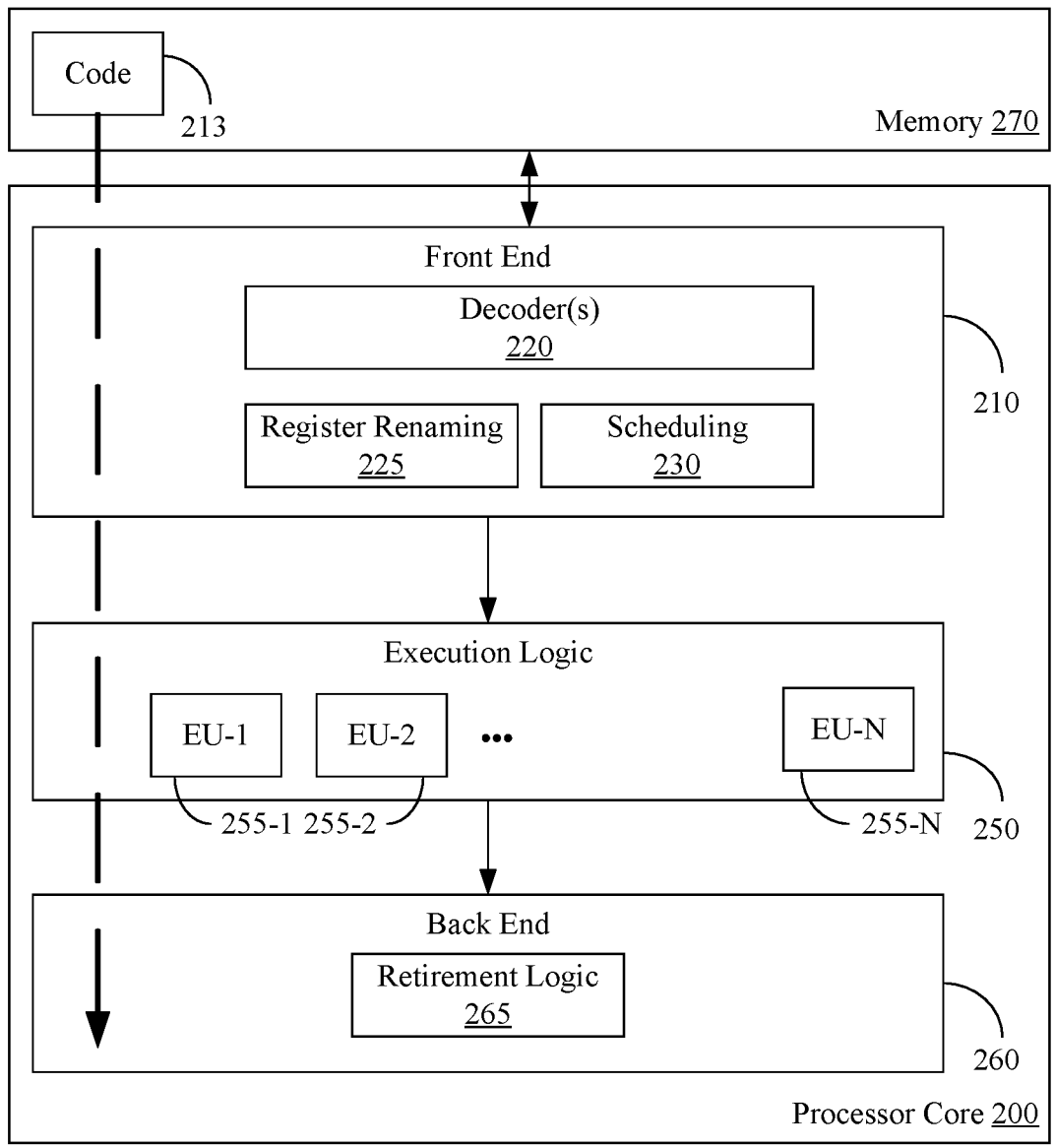
FIG. 7 is a block diagram of an example of a processor according to an embodiment.

FIG. 7 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 7, a processing element may alternatively include more than one of the processor core 200 illustrated in FIG. 7. The processor core 200 may be a single-threaded core or, for at least one embodiment, the processor core 200 may be multithreaded in that it may include more than one hardware thread context (or "logical processor") per core.

FIG. 7 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement one or more aspects of the method 30 (FIGS. 3A to 3C) and/or BIOS field/setting handling, already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 7, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Referring now to FIG. 8, shown is a block diagram of a system 1000 embodiment in accordance with an embodiment. Shown in FIG. 8 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 8 may be implemented as a multi-drop bus rather than point-to-point interconnect.

As shown in FIG. 8, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to that discussed above in connection with FIG. 7.

Each processing element 1070, 1080 may include at least one shared cache 1896a, 1896b (e.g., static random access memory/SRAM). The shared cache 1896a, 1896b may store data (e.g., objects, instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments are not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 8, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 8, the I/O subsystem 1090 includes a TEE 1097 (e.g., security controller) and P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments is not so limited.

As shown in FIG. 8, various I/O devices 1014 (e.g., cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, network controllers, and wireless device(s) 1026 including one or more antennas 1026a (which may in turn be in communication with a computer network), and a data storage unit 1019 such as a disk drive or other mass storage device which may include code 1030, in one embodiment. The code 1030, which may include firmware code, may include instructions for performing embodiments of one or more of the methods described above. Thus, the illustrated code 1030 may implement one or more aspects of the method 30 (FIGS. 3A to 3C) and/or BIOS field/setting handling as discussed herein, and may be similar to the code 213 (FIG. 7), already discussed. Further, an audio I/O 1024 may be coupled to second bus 1020.

Note that other embodiments are contemplated. For example, instead of the point-to-point architecture of FIG. 8, a system may implement a multi-drop bus or another such communication topology.

ADDITIONAL NOTES AND EXAMPLES

Example 1 may include an electronic processing system, comprising a processor, a wireless subsystem communicatively coupled to the processor, an antenna coupled to the wireless subsystem, and logic communicatively coupled to the processor and the wireless subsystem to determine declared antenna gain-related information that corresponds to an estimated actual antenna gain for the antenna, and adjust a parameter of the wireless subsystem based on the declared antenna gain-related information.

Example 2 may include the system of Example 1, wherein the logic is further to retrieve the declared antenna gain-information from a basic input/output system.

Example 3 may include the system of any of Examples 1 to 2, wherein the logic is further to adjust a transmission power of the wireless subsystem based on the declared antenna gain-related information.

Example 4 may include the system of any of Examples 1 to 3, wherein the logic is further to determine if the declared antenna gain-related information is valid based on one or more of a validity indicator, a region indicator, a vendor indicator, and authentication information.

Example 5 may include the system of Example 4, wherein the logic is further to select a profile based on the region indicator, modify the profile based on the declared antenna gain-related information, and apply the modified profile to the wireless subsystem.

Example 6 may include the system of any of Examples 1 to 5, wherein the logic is further to determine a maximum permitted transmission power, and adjust a transmission power for the wireless subsystem based on the maximum permitted transmission power and the declared antenna gain-related information.

Example 7 may include a semiconductor package apparatus, comprising one or more substrates, and logic coupled to the one or more substrates, wherein the logic is at least partly implemented in one or more of configurable logic and fixed-functionality hardware logic, the logic coupled to the one or more substrates to determine declared antenna gain-related information that corresponds to an estimated actual antenna gain for an antenna, and adjust a parameter of a wireless subsystem based on the declared antenna gain-related information.

Example 8 may include the apparatus of Example 7, wherein the logic is further to retrieve the declared antenna gain-information from a basic input/output system.

Example 9 may include the apparatus of any of Examples 7 to 8, wherein the logic is further to adjust a transmission power of the wireless subsystem based on the declared antenna gain-related information.

Example 10 may include the apparatus of any of Examples 7 to 9, wherein the logic is further to determine if the declared antenna gain-related information is valid based on one or more of a validity indicator, a region indicator, a vendor indicator, and authentication information.

Example 11 may include the apparatus of Example 10, wherein the logic is further to select a profile based on the region indicator, modify the profile based on the declared antenna gain-related information, and apply the modified profile to the wireless subsystem.

Example 12 may include the apparatus of any of Examples 7 to 11, wherein the logic is further to determine a maximum permitted transmission power, and adjust a transmission power for the wireless subsystem based on the maximum permitted transmission power and the declared antenna gain-related information.

Example 13 may include the apparatus of any of Examples 7 to 12, wherein the logic coupled to the one or more substrates includes transistor channel regions that are positioned within the one or more substrates.

Example 14 may include a method of managing a wireless subsystem, comprising determining declared antenna gain-related information that corresponds to an estimated actual antenna gain for an antenna, and adjusting a parameter of a wireless subsystem based on the declared antenna gain-related information.

Example 15 may include the method of Example 14, further comprising retrieving the declared antenna gain-information from a basic input/output system.

Example 16 may include the method of any of Examples 14 to 15, further comprising adjusting a transmission power of the wireless subsystem based on the declared antenna gain-related information.

Example 17 may include the method of any of Examples 14 to 16, further comprising determining if the declared antenna gain-related information is valid based on one or more of a validity indicator, a region indicator, a vendor indicator, and authentication information.

Example 18 may include the method of Example 17, further comprising selecting a profile based on the region indicator, modifying the profile based on the declared antenna gain-related information, and applying the modified profile to the wireless subsystem.

Example 19 may include the method of any of Examples 14 to 18, further comprising determining a maximum permitted transmission power, and adjusting a transmission power for the wireless subsystem based on the maximum permitted transmission power and the declared antenna gain-related information.

Example 20 may include at least one computer readable storage medium, comprising a set of instructions, which when executed by a computing device, cause the computing device to determine declared antenna gain-related information that corresponds to an estimated actual antenna gain for an antenna, and adjust a parameter of a wireless subsystem based on the declared antenna gain-related information.

Example 21 may include the at least one computer readable storage medium of Example 20, comprising a further set of instructions, which when executed by the computing device, cause the computing device to retrieve the declared antenna gain-information from a basic input/output system.

Example 22 may include the at least one computer readable storage medium of any of Examples 20 to 21, comprising a further set of instructions, which when executed by the computing device, cause the computing device to adjust a transmission power of the wireless subsystem based on the declared antenna gain-related information.

Example 23 may include the at least one computer readable storage medium of any of Examples 20 to 22, comprising a further set of instructions, which when executed by the computing device, cause the computing device to determine if the declared antenna gain-related information is valid based on one or more of a validity indicator, a region indicator, a vendor indicator, and authentication information.

Example 24 may include the at least one computer readable storage medium of Example 23, comprising a further set of instructions, which when executed by the computing device, cause the computing device to select a profile based on the region indicator, modify the profile based on the declared antenna gain-related information, and apply the modified profile to the wireless subsystem.

Example 25 may include the at least one computer readable storage medium of any of Examples 20 to 24, comprising a further set of instructions, which when executed by the computing device, cause the computing device to determine a maximum permitted transmission power, and adjust a transmission power for the wireless subsystem based on the maximum permitted transmission power and the declared antenna gain-related information.

Example 26 may include a wireless subsystem manager apparatus, comprising means for determining declared antenna gain-related information that corresponds to an estimated actual antenna gain for an antenna, and means for adjusting a parameter of a wireless subsystem based on the declared antenna gain-related information.

Example 27 may include the apparatus of Example 26, further comprising means for retrieving the declared antenna gain-information from a basic input/output system.

Example 28 may include the apparatus of any of Examples 26 to 27, further comprising means for adjusting a transmission power of the wireless subsystem based on the declared antenna gain-related information.

Example 29 may include the apparatus of any of Examples 26 to 28, further comprising means for determining if the declared antenna gain-related information is valid based on one or more of a validity indicator, a region indicator, a vendor indicator, and authentication information.

Example 30 may include the apparatus of Example 29, further comprising means for selecting a profile based on the region indicator, means for modifying the profile based on the declared antenna gain-related information, and means for applying the modified profile to the wireless subsystem.

Example 31 may include the apparatus of any of Examples 26 to 30, further comprising means for determining a maximum permitted transmission power, and means for adjusting a transmission power for the wireless subsystem based on the maximum permitted transmission power and the declared antenna gain-related information.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
   a processor;
   a wireless subsystem communicatively coupled to the processor;
   an antenna coupled to the wireless subsystem; and
   logic communicatively coupled to the processor and the wireless subsystem to:
   determine declared antenna gain-related information that corresponds to an estimated actual antenna gain for the antenna,
   adjust a parameter of the wireless subsystem based on the declared antenna gain-related information,
   select a profile based on a region indicator, wherein the profile is based on an assumed antenna gain,
   identify a difference in antenna gain between the estimated actual antenna gain and the assumed antenna gain,
   determine whether the difference in antenna gain is greater than a predetermined amount,
   in response to the difference being determined to be greater than the predetermined amount, set a delta gain to the difference,
   modify the profile based on the delta gain, and
   apply the modified profile to the wireless subsystem.

2. The system of claim 1, wherein the logic is further to:
   retrieve the declared antenna gain-related information from a basic input/output system.

3. The system of claim 1, wherein the logic is further to:
   adjust a transmission power of the wireless subsystem based on the declared antenna gain-related information.

4. The system of claim 1, wherein the logic is further to:
   determine if the declared antenna gain-related information is valid based on one or more of a validity indicator, the region indicator, a vendor indicator, and authentication information.

5. The system of claim 1, wherein the logic is further to:
   determine a maximum permitted transmission power; and
   adjust a transmission power for the wireless subsystem based on the maximum permitted transmission power and the declared antenna gain-related information.

6. The system of claim 1, wherein the predetermined amount is zero, and the logic is further to:
   in response to the difference being determined to be less than zero, set the delta gain to a value of zero.

7. A semiconductor package apparatus, comprising:
   one or more substrates; and
   logic coupled to the one or more substrates, wherein the logic is at least partly implemented in one or more of configurable logic or fixed-functionality logic hardware, the logic coupled to the one or more substrates to:
   determine declared antenna gain-related information that corresponds to an estimated actual antenna gain for an antenna,
   adjust a parameter of a wireless subsystem based on the declared antenna gain-related information,
   select a profile based on a region indicator, wherein the profile is based on an assumed antenna gain,
   identify a difference in antenna gain between the estimated actual antenna gain and the assumed antenna gain,
   determine whether the difference in antenna gain is greater than a predetermined amount,
   in response to the difference being determined to be greater than the predetermined amount, set a delta gain to the difference,
   modify the profile based on the delta gain, and
   apply the modified profile to the wireless subsystem.

8. The apparatus of claim 7, wherein the logic is further to:
   retrieve the declared antenna gain-related information from a basic input/output system.

9. The apparatus of claim 7, wherein the logic is further to:
   adjust a transmission power of the wireless subsystem based on the declared antenna gain-related information.

10. The apparatus of claim 7, wherein the logic is further to:
    determine if the declared antenna gain-related information is valid based on one or more of a validity indicator, the region indicator, a vendor indicator, and authentication information.

11. The apparatus of claim 7, wherein the logic is further to:
    determine a maximum permitted transmission power; and
    adjust a transmission power for the wireless subsystem based on the maximum permitted transmission power and the declared antenna gain-related information.

12. The apparatus of claim 7, wherein the logic coupled to the one or more substrates includes transistor channel regions that are positioned within the one or more substrates.

13. The apparatus of claim 7, wherein the predetermined amount is zero and the logic is further to:
    in response to the difference being determined to be less than zero, set the delta gain to a value of zero.

14. A method of managing a wireless subsystem, comprising:
    determining declared antenna gain-related information that corresponds to an estimated actual antenna gain for an antenna;
    adjusting a parameter of the wireless subsystem based on the declared antenna gain-related information;
    selecting a profile based on a region indicator, wherein the profile is based on an assumed antenna gain;
    identifying a difference in antenna gain between the estimated actual antenna gain and the assumed antenna gain;
    determining whether the difference in antenna gain is greater than a predetermined amount;
    in response to the difference being determined to be greater than the predetermined amount, setting a delta gain to the predetermined amount;
    modifying the profile based on the delta gain; and
    applying the modified profile to the wireless subsystem.

15. The method of claim 14, further comprising:
    retrieving the declared antenna gain-related information from a basic input/output system.

16. The method of claim 14, further comprising:
    adjusting a transmission power of the wireless subsystem based on the declared antenna gain-related information.

17. The method of claim 14, further comprising:
    determining if the declared antenna gain-related information is valid based on one or more of a validity indicator, the region indicator, a vendor indicator, and authentication information.

18. The method of claim 14, further comprising:
    determining a maximum permitted transmission power; and adjusting a transmission power for the wireless subsystem based on the maximum permitted transmission power and the declared antenna gain-related information.

19. The method of claim 14, wherein the predetermined amount is zero and the method further comprises:
in response to the difference being determined to be less than zero, setting the delta gain to a value of zero.

20. At least one non-transitory computer readable storage medium, comprising a set of instructions, which when executed by a computing device, cause the computing device to:
determine declared antenna gain-related information that corresponds to an estimated actual antenna gain for an antenna;
adjust a parameter of a wireless subsystem based on the declared antenna gain-related information;
select a profile based on a region indicator, wherein the profile is based on an assumed antenna gain;
identify a difference in antenna gain between the estimated actual antenna gain and the assumed antenna gain;
determine whether the difference in antenna gain is greater than a predetermined amount;
in response to the difference being determined to be greater than the predetermined amount, set a delta gain to the difference;
modify the profile based on the delta gain; and
apply the modified profile to the wireless subsystem.

21. The at least one non-transitory computer readable storage medium of claim 20, comprising a further set of instructions, which when executed by the computing device, cause the computing device to:
retrieve the declared antenna gain-related information from a basic input/output system.

22. The at least one non-transitory computer readable storage medium of claim 20, comprising a further set of instructions, which when executed by the computing device, cause the computing device to:
adjust a transmission power of the wireless subsystem based on the declared antenna gain-related information.

23. The at least one non-transitory computer readable storage medium of claim 20, comprising a further set of instructions, which when executed by the computing device, cause the computing device to:
determine if the declared antenna gain-related information is valid based on one or more of a validity indicator, the region indicator, a vendor indicator, and authentication information.

24. The at least one non-transitory computer readable storage medium of claim 20, comprising a further set of instructions, which when executed by the computing device, cause the computing device to:
determine a maximum permitted transmission power; and
adjust a transmission power for the wireless subsystem based on the maximum permitted transmission power and the declared antenna gain-related information.

25. The at least one non-transitory computer readable storage medium of claim 20, wherein the predetermined amount is zero and the at least one non-transitory computer readable storage medium comprises a further set of instructions, which when executed by the computing device, cause the computing device to:
in response to the difference being determined to be less than zero, set the delta gain to a value of zero.

* * * * *